United States Patent [19]

Kawatsuji

[11] Patent Number: 4,773,841
[45] Date of Patent: Sep. 27, 1988

[54] PLATE THICKNESS ADJUSTING APPARATUS IN PHOTOSENSITIVE RESIN PLATE MAKING MACHINE

[75] Inventor: Shinichi Kawatsuji, Fuji, Japan

[73] Assignee: Asahi Kasei Kogyo Kabushiki Kaisha, Osaka, Japan

[21] Appl. No.: 106,273

[22] Filed: Oct. 9, 1987

[30] Foreign Application Priority Data

Oct. 14, 1986 [JP] Japan .................. 61-242162

[51] Int. Cl.⁴ .............................. B29C 41/12
[52] U.S. Cl. ........................ 425/141; 118/415; 156/500; 156/501; 249/157; 249/161; 355/100; 425/219
[58] Field of Search .............. 425/64, 90, 99, 113, 425/117, 125, 141, 219, 220, 218, 451.7; 249/157, 158, 161, 155; 156/500, 501; 118/415, 108, 120; 355/53, 72, 85, 86, 100

[56] References Cited

U.S. PATENT DOCUMENTS

| | | | |
|---|---|---|---|
| 3,687,785 | 8/1972 | Akamatsu | 156/501 |
| 3,743,469 | 7/1973 | Gibbons | 425/451.7 |
| 3,832,177 | 8/1974 | Akamatsu et al. | 430/347 |
| 3,837,887 | 9/1974 | Akamatsu et al. | 355/100 |
| 4,056,423 | 11/1977 | Hughes | 156/356 |
| 4,214,942 | 7/1980 | Inoko et al. | 156/500 |
| 4,382,580 | 5/1983 | Hellander | 254/104 |

FOREIGN PATENT DOCUMENTS 47-32687 8/1972 Japan .
51-10123 4/1976 Japan .

*Primary Examiner*—Jay H. Woo
*Assistant Examiner*—James C. Housel
*Attorney, Agent, or Firm*—Finnegan, Henderson, Farabow, Garrett and Dunner

[57] ABSTRACT

An apparatus for adjusting the thickness of a resin plate formed in a resin plate making machine comprising stacked, wedge-shaped members, each wedge-shaped member having an inclined surface slidably contacting the other inclined surface, the top most member being connected to either spacers positioned above a rigid base plate on which the resin plate is formed, or to the rigid base plate itself, for adjusting the height of the spacers relative to the base plate as the wedge-shaped members are moved relative to one another in the direction of inclination of the inclined surfaces.

10 Claims, 6 Drawing Sheets

PLATE THICKNESS ADJUSTING APPARATUS IN PHOTOSENSITIVE RESIN PLATE MAKING MACHINE

BACKGROUND OF THE INVENTION

1. Field of the Invention

The present invention relates to an apparatus for adjusting the thickness of a resin printing plate within a given range. More particularly, the invention relates to an apparatus for forming a printing relief by molding a liquid photosensitive resin on a rigid base plate, adjusting the thickness of the resin, and then subjecting the relief to imagewise exposure.

2. Description of the Related Art

Figure 10A:
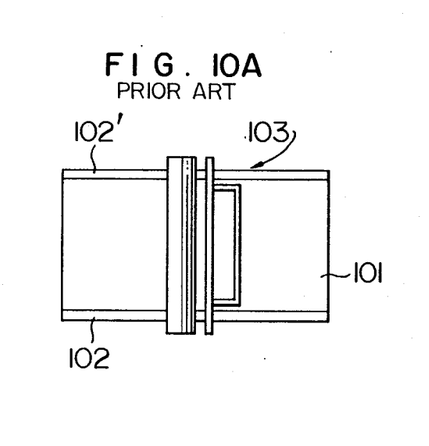
FIG. 10A is a diagram of a conventional thickness adjusting mechanism incorporating the spacer-layer method.
Figure 10B:
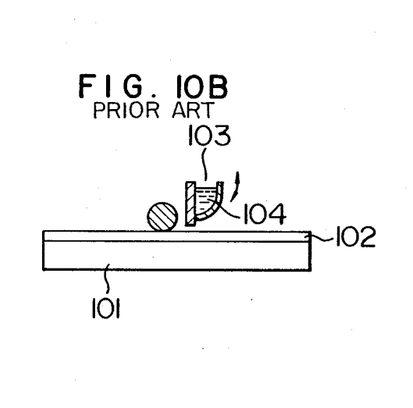
FIG. 10B is a front sectional view of the device of FIG. 10A.

Heretofore, there have been known machines which adjust the thickness of a resin layer on a printing plate. One such machine incorporates the so-called spacer-laying method. One example thereof is shown in FIGS. 10A and 10B wherein spacers 102 and 102' are laid on opposite sides of rigid base plate 101. Liquid photosensitive resin feeding means 103 is moved along spacers 102 and 102', and liquid photosensitive resin 104 is fed onto rigid base plate 101 by actuation of liquid photosensitive resin feeding means 103 to form a resin layer having a predetermined thickness. The thickness of the resin layer is changed by interchanging the different size spacers 102 and 102' to adjust the height of the resin feeding means over the base plate.

A second type of machine incorporates the so-called elevation method which is disclosed, for example, in Japanese Patent Examined Publication No. 33061/80. In this method plate thickness is adjustable by a carriage provided with a resin feeding means which is movable upwardly and downwardly with reference to a rigid base plate. A third type of device incorporates the so-called molding base elevation method wherein a rigid base is provided so that it can be moved upwardly and downwardly on carriage rails relative to the resin carriage to adjust plate thickness.

However, there are drawbacks to the methods mentioned above. The spacer-laying method requires much time for replacing the spacers depending on the desired thickness of the resin plate. Furthermore, the spacers are long and relatively heavy and are difficult to handle. Further, it is necessary to maintain storage space for the different size spacers. Moreover, foreign materials are apt to stick to the spacers during the replacing operation, and if plate making is effected with the spacers having the foreign materials thereon, plate thickness becomes uneven.

The above mentioned elevation method requires a resin feeding means which is freely movable up and down. Therefore, the mechanism inevitably must be large, heavy, and very complicated. Thus, mechanical accuracy in the vertical movement of the feeding means is difficult to attain.

Furthermore, the molding base elevation method requires a mechanism for lifting and lowering a large and heavy rigid base plate while maintaining a high plane accuracy and parallel relation with the moving rails, and hence, the apparatus is largely overly complicated and expensive. Moreover, since the molding base plate is movable, it is difficult to maintain with repeated use and time the level of the molding base plate and the parallel relation of the base plate with the moving rails.

It is an object of the present invention to provide an apparatus for adjusting the thickness of resin plates which is free from the problems and/or defects in the conventional mechanisms and methods, and which provides a photosensitive resin plate superior in repetitive reproducibility and having a high degree of accuracy.

It is a further object of the present invention to provide a resin plate making machine capable of adjusting the thickness of the resin plate wherein the adjusting mechanism is compact, simple in construction, relatively light weight, and controllable from a remote station.

SUMMARY OF THE INVENTION

To achieve the foregoing intentions, and in accordance with the purposes of the invention as embodied and broadly described herein, there is provided a plate thickness adjusting apparatus in a machine for making printing plates, said printing plates being formed by molding a liquid photosensitive resin into a printing relief on a rigid base plate, comprising a rigid base plate; a pair of spacers disposed on opposite sides of said rigid base plate; means for vertically adjusting the height of said spacers relative said base plate, said adjusting means comprising first and second wedge-shaped members, each said member having an inclined surface, said wedge-shaped members being vertically stacked on each other such that said inclined surfaces slidably contact one another, said spacers being connected to a top surface, opposite the inclined surfaces, of one of said members; and a driving means for moving said first wedge-shaped member relative said second wedge-shaped member in the direction of inclination of said inclined surfaces to vertically adjust said spaces.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment and method given below, serve to explain the principles of the invention.

DESCRIPTION OF THE PREFERRED EMBODIMENT

Reference will now be made in detail to the present preferred embodiment(s) and method of the invention as illustrated in the accompanying drawings, in which like reference characters designate like or corresponding parts throughout the several drawings.

Figure 1:
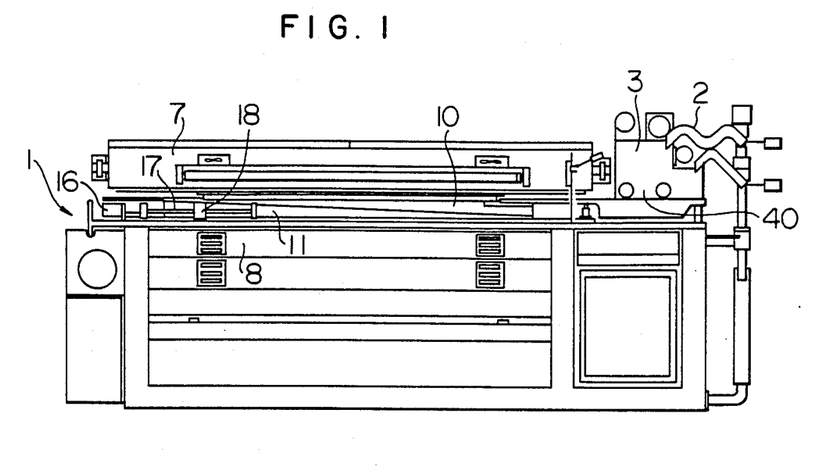
FIG. 1 is a front view of plate making machine provided with the thickness adjusting apparatus of the present invention.
Figure 2:
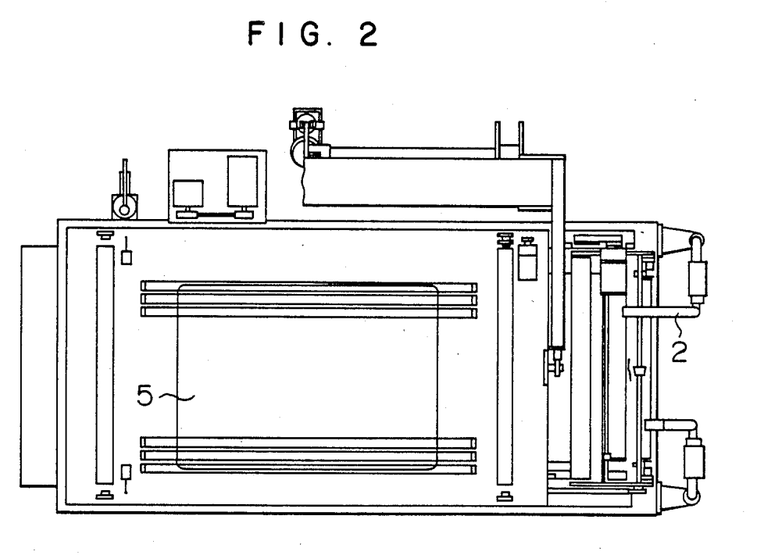
FIG. 2 is a plan view of the machine of FIG. 1.
Figure 5:
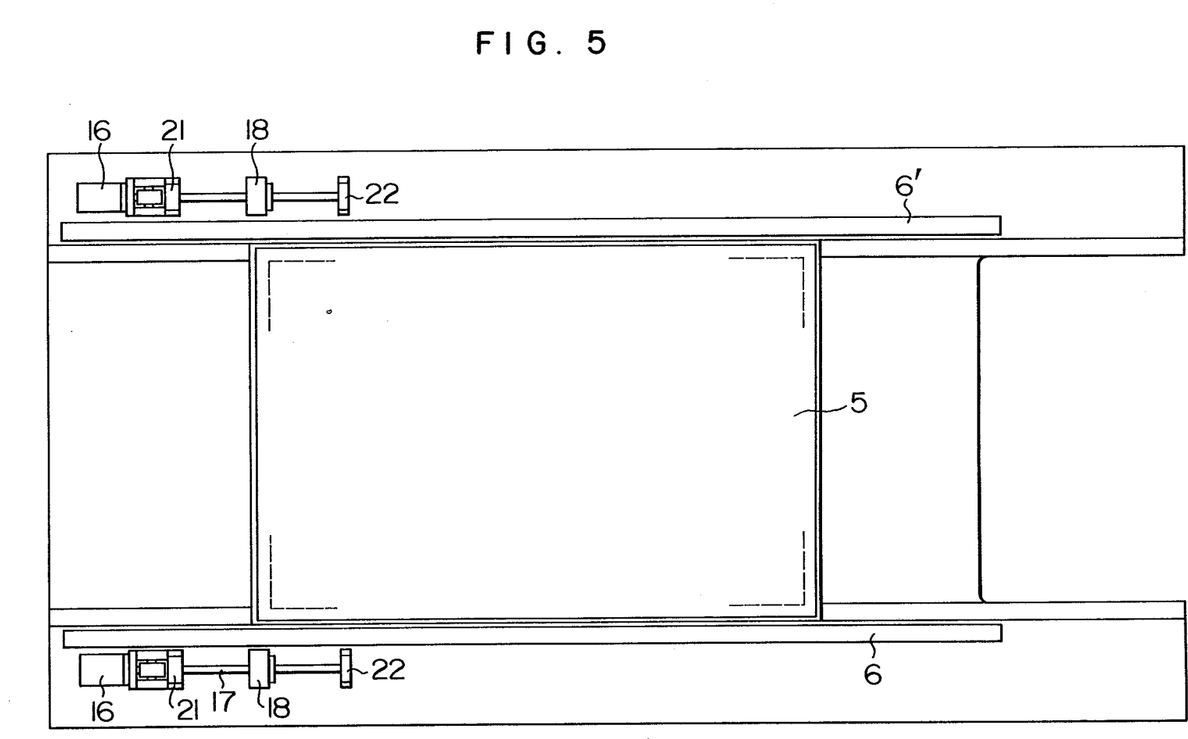
FIG. 5 is a plan view of the thickness adjusting apparatus of FIG. 4.

In accordance with the present invention, and with reference to FIGS. 1, 2 and 5, there is provided a plate making apparatus having a body; the body is generally indicated by 1, which includes a pipe 2 for feeding a liquid photosensitive resin to a bucket 40 in a carriage 3. A rigid base plate 5 is centrally positioned in body 1 to receive the photosensitive resin from carriage 3. Spacers 6 and 6' are provided proximate opposite sides of rigid base plate 5, and carriage 3 is movable positioned on spacers 6 and 6'. A photosensitive resin layer is formed on rigid base plate 5 by moving carriage 3 along spacers 6 and 6' and depositing resin from a bucket 40 of carriage 3 on base plate 5. An upper light source box 7 and a lower light source 8 are disposed above and below base plate 5, respectively.

Typically in plate making, upper light source box 7 is opened, and a negative film is placed on base plate 5. Plate 5 is conventionally formed of glass. A cover film is then placed over the negative film, and carriage 3 is moved over spacers 6 and 6' to squeeze the resin onto the cover film. The thickness of the resin thus fed is adjusted to the desired thickness in accordance with the vertical distance between the spacers 6 and 6' and base plate 5, since carriage 3 moves over base plate 5 on spacers 6 and 6'.

Then, upper light source box 7 is closed and the photosensitive resin layer is irradiated with actinic rays and is subjected to relief exposure through the negative film by lower light source 8. After completion of the exposure, upper light source box 7 is again opened, the exposed photosensitive resin plate is taken out together with the cover film, the cover film is removed, and the unhardened portion of the resin plate is washed out and the resin plate is subjected to post-exposure and drying to obtain a printing plate.

The photosensitive plate forming machine according to the present invention includes means for adjusting the distance between the base plate and the spacers.

In accordance with the invention, the plate making machine includes means for adjusting the height of the spacers relative to the base plate. Embodied herein, adjusting means includes upper and lower-wedged shaped members 10 and 11 having inclined surfaces 9 and 9' slidably contacting each other. Upper wedge-shaped 10 is fixedly connected to the upper surface of spacer 6, and lower wedge-shaped member 11 is moved in the direction of inclination of the wedge-shaped members to thereby move the contacting inclined surfaces of wedge-shaped members 10 and 11 relative one another, whereby said spacer 6 placed or fixed on upper wedge-shaped member 10 is moved vertically with reference to plate 5. The feeding rate of the resin is controlled to change the thickness of the resin layer deposited on plate 5 as carriage 3 moves along the spacers 6 and 6'.

Figures 3, 4:
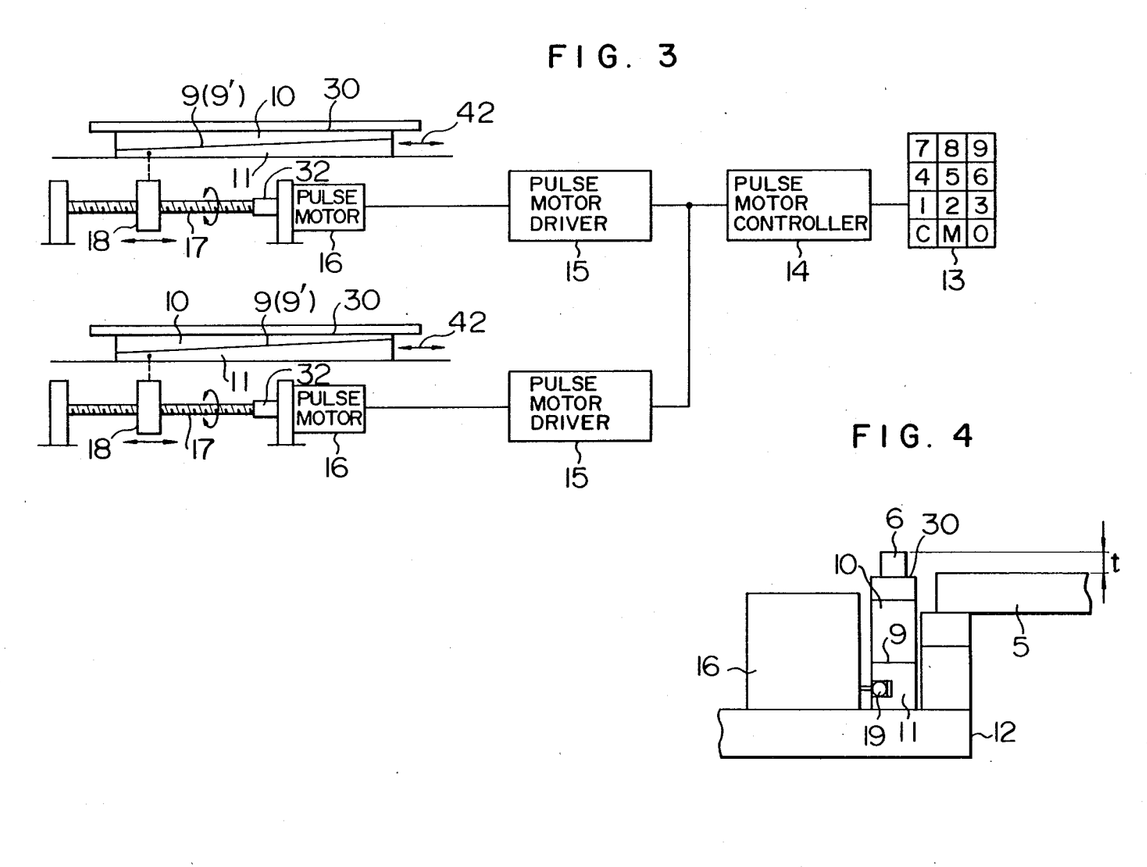
FIG. 3 is a block diagram illustrating the elements of the thickness adjusting apparatus of the present invention.
FIG. 4 is a side view of a thickness adjusting apparatus of the present invention.

With reference to FIGS. 3 and 4, the adjusting means comprised of wedge-shaped members 10 and 11 are shown in more detail. Members 10 and 11 each have an inclined surface 9 and 9', respectively. Upper wedge-shaped member 10 is stacked on lower wedge-shaped member 11 in such a manner that the inclined surfaces 9 and 9' are in contact with each other, and are movable relative one another. Spacer 6 is fixed on top surface 30 of wedge-shaped member 10. Identical upper and lower wedge-shaped members are positioned on the opposite side of base plate 5, and spacer 6' is fixed to the top surface of the upper wedge-shaped member of this pair.

The plate thickness adjusting apparatus further includes driving means for moving the wedge-shaped members relative each other. As embodied herein, and with reference to FIGS. 5-7, the driving means includes pulse motors 16 having drive shafts 32. Drive shafts 32 are connected to threaded screws 17. Screws 17 are intermeshed with transfer units 18. A holder 20 is provided for mounting pulse motor 16, and 21 and 22 indicate bearings for ball screw 17.

Figure 6:
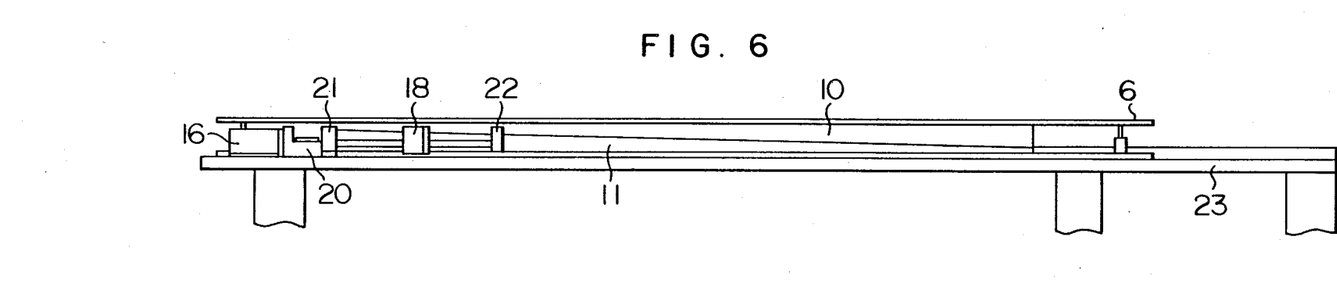
FIG. 6 is a front view of the apparatus of FIG. 5.
Figure 7:
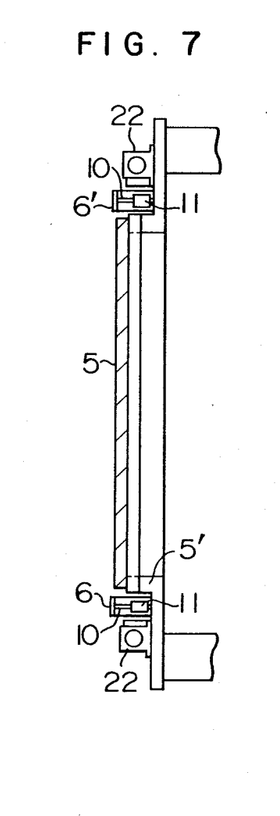
FIG. 7 is a partial side view of the apparatus of FIG. 5.

Rotation of screws 17 is transfered into linear movement of transfer unit 18, thereby causing linear movement of wedge-shaped member 11 which is mechanically connected to transfer unit 18 by connecting member 19. Lower member 11 is moved in a direction 42 which is the direction of inclination of inclined surfaces 9 and 9', a discrete distance to vertically move spacers 6 and 6' a desired amount. The discrete distance member 11 is moved in direction 42 is determined in accordance with the angle of the inclination of inclined surfaces 9 and 9'. In this case, members 11 are synchronously moved by pulse motors 16.

The pulse motors 16, may include a control means, which as embodied herein by way of example and not limitation, may comprise a microprocessor type controller 14 shown in FIG. 3 which receives input commands from a controller or operator, and transmits signals in accordance with the input commands to the pulse motor to control operation of the motor and movement of the wedge-shaped members.

In the above description, lower wedge-shaped member 11 is moved by pulse motors 16, however, it will be obvious to those skilled in the art the same effect can be attained by moving the upper sharp-wedge plate 10. Furthermore, if necessary, it is also possible to utilize more than 2 wedge-shaped members in the adjusting means, one of which is made slidable relative the others. Moreover, in the above description, the spacer adjusting means and the driving means are provided at opposite sides of plate 5, in the direction parallel to spacers 6 and 6' however, the wedge-shaped members may also be disposed at the opposite two sides of the lower glass plate 5 in the direction normal with the direction of movement of carriage 3 over plate 5. Furthermore, the present invention is not limited to only two sets of wedge-shaped members 10 and 11, and any desired number of sets may be used.

Figures 8A, 8B, 8C:
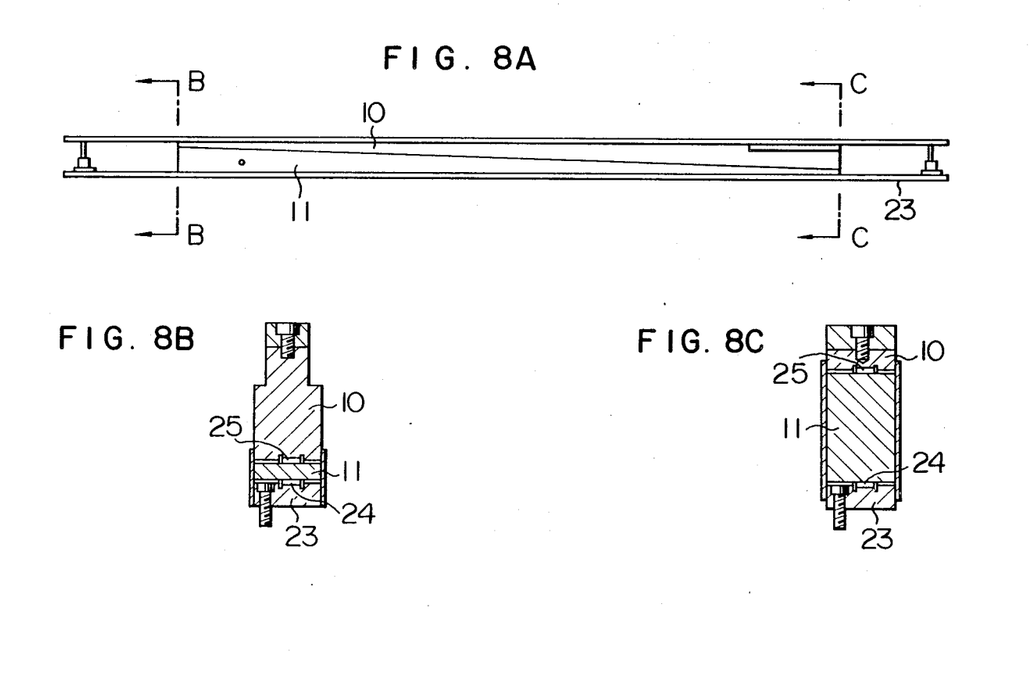
FIG. 8A illustrates the superposition of the wedge-shaped members of a second preferred embodiment of the present invention.
FIG. 8B is a cross section taken at line B—B of FIG. 8A.
FIG. 8C is a cross section taken at line C—C in FIG. 8A.

Since movement of the upper member 10 and the lower member 11 relative one another is one corresponding to the very delicate change of plate thickness, it is desirable to carry out the sliding movement accurately and smoothly. To achieve smoother operation of the adjusting means, and with reference to FIGS. 8A, 8B and 8C, roller bearing 24 may be provided on the upper face of a supporting plate 23 fixed to a body 112 which supports the lower wedge-shaped member 11, and roller bearing 25 may be provided on the inclined surface 9 of the upper wedge-shaped member 10 which slidably contacts with inclined surface 9' of member 11. In this embodiment of the present invention, inclined surfaces 9 and 9' do not directly contact one another, rather, each surface contacts roller bearing 25. Thus, when lower member 11 is moved relative to upper member 10, the inclined surfaces move smoothly relative to each other on the bearings. Moreover, any number of bearings may be disposed between the respective surfaces.

According to the construction of the present preferred embodiment, plate thickness can be accurately adjusted by a very simple operation. Moreover, excessive loads are not applied to any portions of the apparatus. Attachment of foreign materials to base plate 5 may be prevented by providing a dust seal or the like over the adjusting means.

Figure 11:
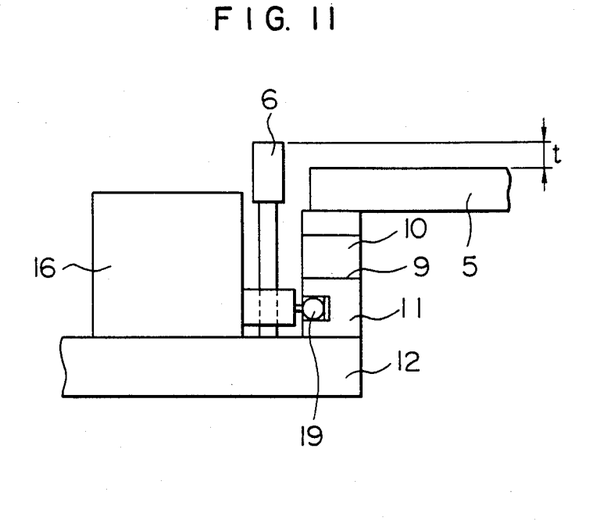
FIG. 11 is a side view of another embodiment of the thickness adjusting apparatus of the present invention.

Although the present preferred embodiment of the invention described above utilized stacked, wedge-shaped members 10 and 11, with the upper surface of the top most member being connected to spacers 6 and 6', the invention is not limited thereto. The stacked, wedge-shaped members may be connected to the rigid base plate 5 to vertically adjust the base plate relative to stationary spacers as shown in FIG. 11 to achieve the purposes and advantages of the present invention.

Moreover, both the spacers and the base plate may be connected to respective sets of stacked, wedge-shaped members such that both the spacers and the base plate are vertically adjustable relative to one another.

EXAMPLES OF THE OPERATION AT THE PRESENT PREFERRED EMBODIMENT

An adjusting means comprising two pairs of wedge-shaped members made of bearing steel and having an oblique angle $\theta$, wherein $\tan \theta = 1/35$, on the inclined surfaces were mounted on respective base plates. A pulse motor and pulse motor controller, were operably connected to the lower wedge-shaped members, moved the wedge-shaped members relative to each other in the direction of inclination of the inclined surfaces to adjust the height of the top surface of the upper member. The results are shown in Table 1.

Figure 9:
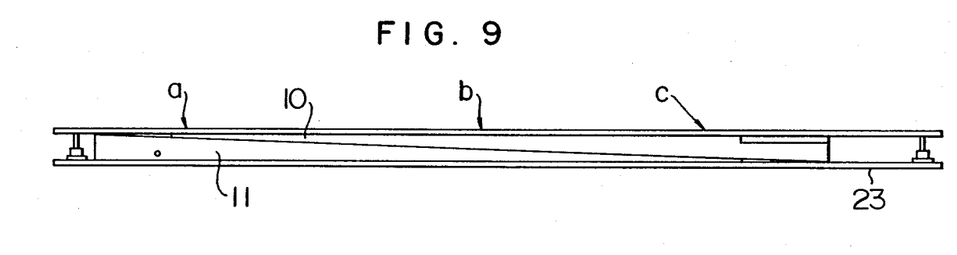
FIG. 9 is a front view of the preferred embodiment of the present invention with the inclined surface of the wedge-shaped members slidably contacting one another.

In Table 1, pulse number indicates the pulse number which was input in the pulse motor, and the change of the height of the uppermost surface of the upper wedge-shaped member was measured at the points (a), (b) and (c) of FIG. 9 at every 3,500 pulses. FIG. 9 illustrates the position of the wedge-shaped members at the lowest height.

TABLE 1

| Pulse Number | a | | b | | c | |
|---|---|---|---|---|---|---|
| | Lifting | Lowering | Lifting | Lowering | Lifting | Lowering |
| 0 | 0 | 0.003 | 0 | 0.004 | 0 | 0.004 |
| 3,500 | 1.005 | 2.003 | 1.005 | 1.005 | 1.006 | 1.007 |
| 7,000 | 1.995 | 2.004 | 2.003 | 2.007 | 2.008 | 2.009 |
| 10,500 | 3.003 | 3.005 | 3.004 | 3.006 | 3.009 | 3.009 |
| 14,000 | 4.000 | 4.000 | 4.007 | 4.009 | 4.009 | 4.010 |
| 17,500 | 4.995 | 4.996 | 5.005 | 5.008 | 5.010 | 5.012 |
| 21,000 | 5.993 | 5.994 | 6.008 | 6.010 | 6.009 | 6.011 |
| 24,500 | 6.990 | 6.990 | 7.011 | 7.011 | 7.012 | 7.012 [mm] |

A photosensitive resin plate was made by moving the wedge-shaped members with an input commands $P = 3,500 \ (1.02T + 0.27)$ [P = pulse number, T = thickness of plate (mm)] and 7.00 mm as the desired thickness to the pulse motor controller. As a result, plates were obtained having an average thickness $7.00 \pm 0.2$ mm with a maximum variation of $\pm 0.08$ mm. These results are superior to those achieved with the more complex apparatus used in the prior art.

Additional advantages and modifications will readily occur to those skilled in the art. The invention in its broader aspects is, therefore, not limited to the specific details, representative apparatus, and illustrative examples shown and described. Accordingly, departures may be made from such details without departing from the spirit or scope of applicant's general inventive concept.

What is claimed is:

1. A plate thickness adjusting apparatus for use in a machine for making printing plates, said printing plates being formed by molding a liquid photosensitive resin into a printing relief on a rigid base plate, comprising
   (i) a rigid base plate;
   (ii) a pair of spacers disposed on opposite sides of said rigid base plate;
   (iii) means for vertically adjusting the height of said spacers relative to said base plate, said adjusting means comprising first and second wedge-shaped members, each said member having an inclined surface, said wedge-shaped members being vertically stacked on each other such that said inclined surfaces slidably contact one another, each of said spacers being connected to a respective top surface, opposite the inclined surfaces, of the upper one of said stacked members; and
   (iv) driving means for moving said first wedge-shaped member relative to said second wedge-shaped member in the direction of inclination of said inclined surfaces to vertically adjust said spacers.

2. An apparatus according to claim 1, wherein said driving means includes a pulse motor having a shaft operably connected to a threaded screw member, and transfer means, operably connected to said screw member and said first wedge-shaped member, for transferring rotational movement of said shaft and said screw member into linear movement of said first wedge-shaped member.

3. An apparatus according to claim 2, including control means for controlling said driving means, said control means being operable to generate output signals to control the operation of said driving means in accordance with input commands of an operator.

4. The apparatus of claim 1, including first bearing means disposed between said contacting inclined surfaces for assisting the relative movement between said inclined surfaces.

5. The apparatus of claim 4, wherein the first wedge-shaped member is movably mounted on a stationary base, including second bearing means disposed between said first wedge-shaped member and said stationary base for assisting the relative movement between the first wedge-shaped member and said base.

6. A plate-making machine for making photosensitive resin plates, comprising:
   a base plate;
   a pair of spacers disposed on opposite sides of said base plate a predetermined distance above said base plate;

carriage means, movable along said spacers over said base plate, for depositing and leveling photosensitive resin on said base plate;

means for selectively adjusting said predetermined distance between said spacers and said base plate, said adjusting means including at least one pair of stacked wedge-shaped members, each said wedge-shaped member having an inclined surface slidably contacting the inclined surface of the other wedge-shaped member of the pair, said pair of wedge-shaped members being disposed below and connected to said base plate; and driving means for moving one of said stacked wedge-shaped members relative to the other wedge-shaped member in the direction of inclination of the inclined surfaces to thereby selectively adjust the vertical distance of said base plate relative to said spacers in accordance with the amount of relative movement between said inclined surfaces and the angle of inclination of said inclined surfaces.

7. A machine according to claim 6, wherein said driving means includes a pulse motor having a shaft operably connected to a threaded screw member, and transfer means, operably connected to said screw member and said first wedge-shaped member, for transferring rotational movement of said shaft and said screw member into linear movement of said first wedge-shaped member.

8. A machine according to claim 7, including control means for controlling said driving means, said control means being operable to generate output signals to control the operation of said driving means in accordance with input commands of an operator.

9. The machine of claim 6, including first bearing means disposed between said contacting inclined surfaces for assisting the relative movement between said inclined surfaces.

10. The machine of claim 9, wherein one of said pair of stacked wedge-shaped members is movably mounted on a stationary base, and including second bearing means disposed between said one wedge-shaped member and said stationary base for assisting the relative movement between the first wedge-shaped member and said base.

* * * * *